(12) United States Patent
Keyser

(10) Patent No.: US 6,579,105 B2
(45) Date of Patent: Jun. 17, 2003

(54) ELECTRICAL CONNECTOR ASSEMBLY

(75) Inventor: Frank T. Keyser, Elk Grove Village, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/999,360

(22) Filed: Nov. 1, 2001

(65) Prior Publication Data

US 2003/0082932 A1 May 1, 2003

(51) Int. Cl.[7] .............................................. H01R 12/00
(52) U.S. Cl. ........................................ 439/66; 439/620
(58) Field of Search .......................... 439/66–75, 608, 439/620, 83; 361/815

(56) References Cited

U.S. PATENT DOCUMENTS

| | | | | |
|---|---|---|---|---|
| 4,341,433 A | * | 7/1982 | Cherian et al. | 439/620 |
| 5,259,777 A | * | 11/1993 | Schuder et al. | 439/188 |
| 5,548,488 A | * | 8/1996 | Hansen | 361/815 |
| 5,646,522 A | * | 7/1997 | Etemadpour et al. | 324/158.1 |
| 5,703,753 A | * | 12/1997 | Mok | 361/715 |
| 5,808,875 A | * | 9/1998 | McMahon et al. | 361/777 |
| 6,413,119 B1 | * | 7/2002 | Gabrisco, Jr. et al. | 439/620 |

* cited by examiner

Primary Examiner—Tho D. Ta
Assistant Examiner—Larisa Tsukerman
(74) Attorney, Agent, or Firm—Stacey E. Caldwell

(57) ABSTRACT

An electrical connector assembly includes a housing assembly having a bottom support structure with a top inside face and a top support structure with a bottom inside face. A first flat circuit is mounted to the top inside face of the bottom support structure and has a hole therethrough. A second flat circuit is mounted to the bottom inside face of the top support structure. At least one conductive terminal extends into the bottom support structure and includes a laterally projecting wing portion for engaging an appropriate conductor on the first flat circuit. A head portion of the terminal engages an appropriate conductor on the second flat circuit. A spring portion of the terminal extends between the wing portion and the head portion to bias the wing portion and head portion in opposite directions into engagement with the respective conductors of the first and second flat circuits.

33 Claims, 4 Drawing Sheets

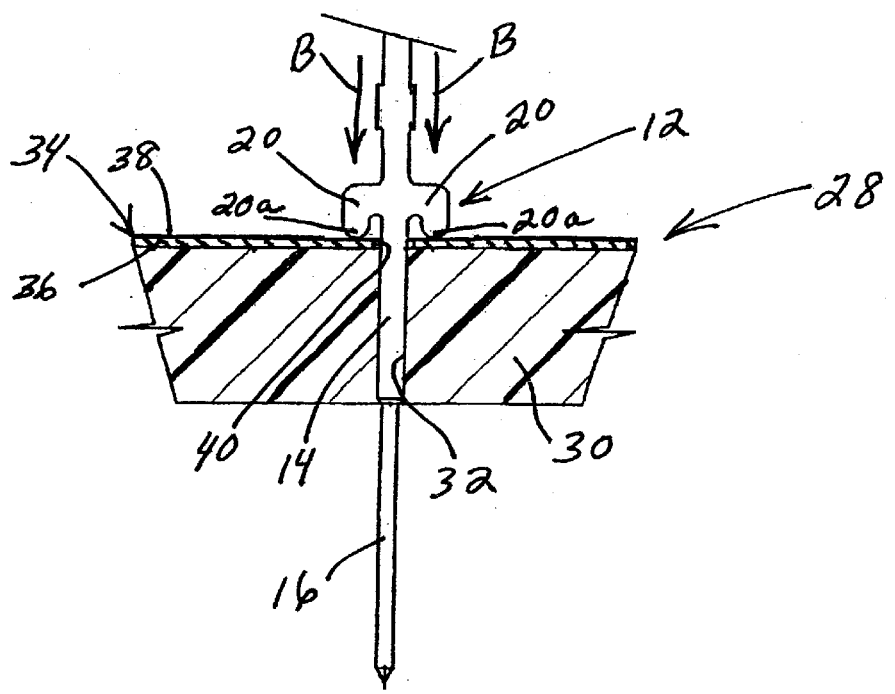
FIG. 4
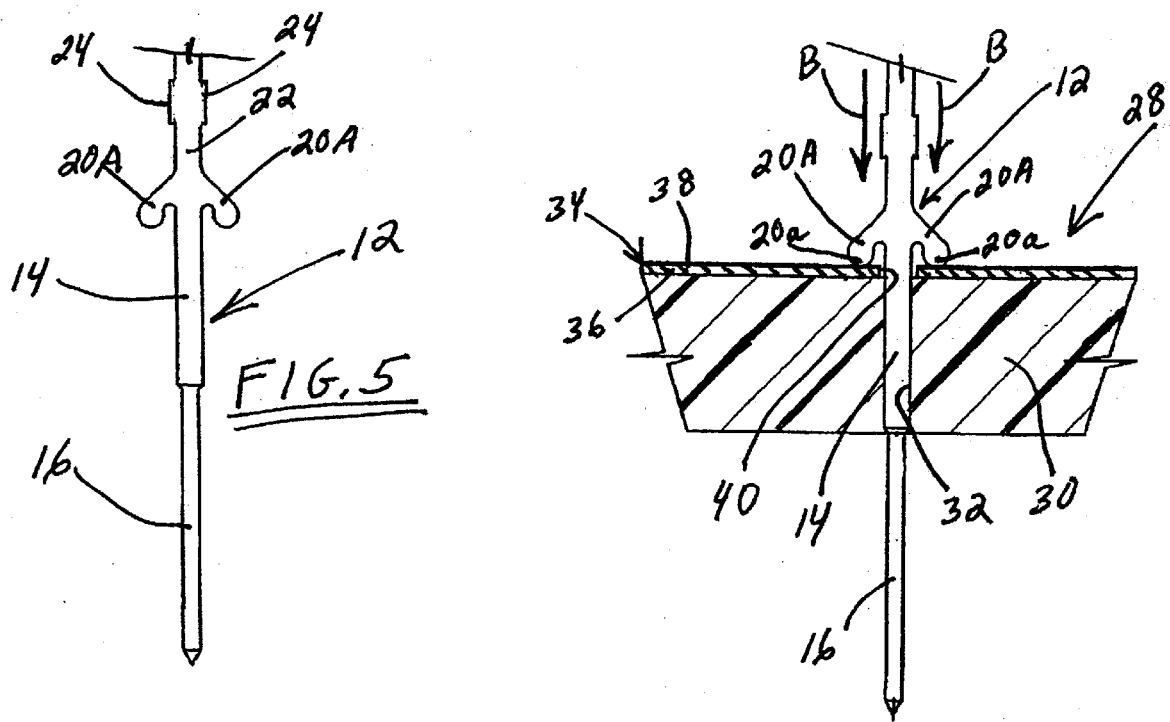
FIG. 5
FIG. 6

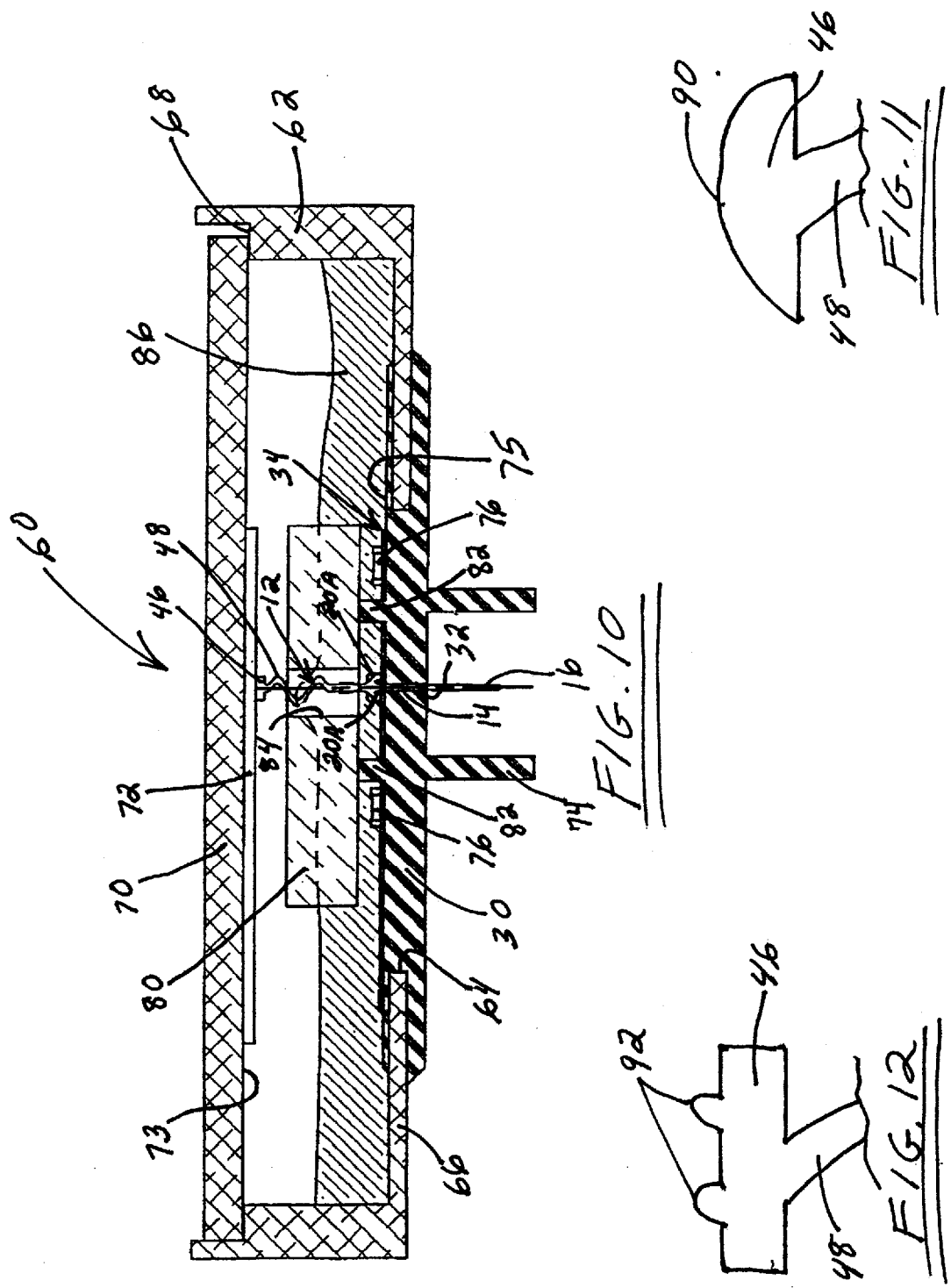

ELECTRICAL CONNECTOR ASSEMBLY

FIELD OF THE INVENTION

This invention generally relates to the art of electrical connectors and, particularly, to an electrical connector assembly incorporating a spring-loaded terminal.

BACKGROUND OF THE INVENTION

Numerous electrical connectors have been designed for utilization with a flat circuit which may be mounted directly on the connector or connected in circuit with terminal pins on the connector. An example of a flat circuit is a flat flexible circuit which includes a flat flexible dielectric substrate having one or more holes therein for receiving one or more terminal pins. A ductile conductive film or other circuit trace system is deposited on the substrate in an area at least about the hole or holes. The terminal pins are inserted into the holes in the substrate to establish electrical and mechanical connections between the pins and the flat flexible circuit. Typically, each hole is smaller in diameter than a respective pin. Alternatively, the pin may be punched through the flat flexible circuit to establish the electrical and mechanical connection therewith.

In order to assure good electrical and mechanical connections in these types of electronic devices or electrical connectors, solder or other adhesives often are used. For instance, in U.S. Pat. No. 4,970,624, dated Nov. 13, 1990 and assigned to the assignee of the present invention, uni-axial adhesive is deposited on the flat flexible circuit about the hole which is penetrated by the terminal pin. The adhesive includes a non-conductive base incorporating randomly spaced conductive particles. When the terminal pin is forced through the adhesive, a portion of the adhesive is carried with the terminal pin between the pin and the flat flexible circuit. The carried portion of the adhesive is compressed for establishing contact between the conductive particles and, thereby, conductivity between the terminal pin and the flat flexible circuit, leaving the adhesive other than that portion in a non-conductive state. Such adhesives often are called "Z-axis" adhesives. These adhesive were developed to replace soldering techniques which require specific temperature resistant components and substrates.

Conductive adhesives are used in other applications involving flat flexible circuits. For instance, in U.S. Pat. No. 5,456,616, dated Oct. 10, 1995 and assigned to the assignee of the present invention, the connector housing is fabricated of a die cast metallic material, such as of magnesium, aluminum or the like. The ductile film on the flat flexible circuit is fabricated of a different metallic material, such as copper or the like and, in fact, may be plated with still a different metallic material such as a tin/lead alloy. The conductive film on the flat flexible circuit acts as a ground plane against the rear face of the connector housing. The housing has a plurality of pins which project through holes in the flat flexible circuit. Using a "Z-axis" adhesive between the housing pins and the flat flexible circuit not only is expensive, as described above, but the conductive interface between the different metal components is limited to the areas of pressure. Consequently, that patent teaches the use of an omni-directional conductive adhesive deposited on the conductive film over the areas of the holes therein, the conductive adhesive expanding the conductive interface between the metal housing and the metal ground plane defined by the conductive film.

Although such uses of conductive adhesives, whether the adhesives are Z-axis adhesives or omni-directional adhesives, serve their intended purposes in certain applications, they are relatively expensive both in the cost of the adhesives as well as their methods of use. In addition, the use of either type of conductive adhesive is costly in terms of secondary operations and costs associated with the metal particles, not to mention the problem of clogging adhesive dispensers by the metallic particles.

Because of the problems associated with the use of conductive adhesives, a unique system was devised as disclosed in U.S. Pat. No. 5,384,435, dated Jan. 24, 1995 and assigned to the assignee of the present invention. That patent solves the problems with conductive adhesives by establishing an electrical connection directly between the terminal pin and the flat conductor on the flat flexible substrate by controlling various parameters between the pin and the substrate. Although this system has proven quite effective, there remains a continuing problem in electrical connectors or electronic devices wherein the pins are very closely spaced, i.e., in very high density connectors. In particular, if the interference between a pin and the substrate produces a stress in the substrate, the stress is magnified in high density applications and results in what is called a systematic stress that causes stress concentrations and can even result in substrate fractures. The present invention is directed to solving this myriad of problems in an extremely simple manner by producing an electrical connection between a contact pin and a flat circuit exclusively by compression which results in no stress being imparted to the substrate of the flat circuit. This unique system can be used in a wide variety of applications as will be seen herein.

SUMMARY OF THE INVENTION

An object, therefore, of the invention is to provide a new and improved electrical connector assembly of the character described.

In the exemplary embodiment of the invention, the electrical connector assembly includes a housing assembly having a bottom support structure with a top inside face and top support structure with a bottom inside face. A first flat circuit is mounted to the top inside face of the bottom support structure and includes a hole therethrough. A second flat circuit is mounted to the bottom inside face of the top support structure. At least one elongated conductive terminal extends into the bottom support structure and includes a laterally projecting wing portion for engaging an appropriate conductor on the first flat circuit. A head portion of the terminal engages an appropriate conductor on the second flat circuit. A spring portion of the terminal extends between the wing portion and the head portion to bias the wing portion and head portion in opposite directions into engagement with the respective conductors of the first and second flat circuits.

As disclosed herein, the terminal includes a mounting portion extending into a hole in the bottom support structure of the housing. A contact pin extends from the mounting portion beyond a bottom outside face of the bottom support structure for interconnection to a contact of an appropriate complementary connecting device. The spring portion of the terminal has a wave configuration. Preferably, a pair of the wing portions project laterally from opposite sides of the terminal. In one embodiment, the head portion of the terminal includes a rounded concave surface for engaging the conductor on the second flat circuit. In a second embodiment, the head portion includes a pair of bumps for engaging the conductor on the second flat circuit.

According to one aspect of the invention, the first flat circuit comprises a filter circuit, with at least one capacitor coupled to the conductor thereon. Preferably, the first flat circuit is a flexible circuit. In addition, a ferrite filter block is provided surrounding the terminal in the area of the spring portion thereof.

According to another aspect of the invention, the second flat circuit comprises a ceramic based power circuit. The top support structure comprises a metal heat sink.

Finally, the housing assembly includes a peripheral casting with an open top which is closed by the top support structure. The bottom support structure is formed by a dielectrical plastic member overmolded in an opening in the bottom of the peripheral casting.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 4 is a section through an electrical connector device incorporating the terminal of FIG. 1;

FIG. 5 is a side elevational view of a second embodiment of a terminal according to the invention;

FIG. 6 is a view similar to that of FIG. 4, but incorporating the terminal of FIG. 5;

FIG. 10 is a section through another embodiment of a connector assembly incorporating the terminal of FIG. 8;

FIG. 11 is a fragmented elevational view of a different configuration of the head portion of the terminal; and FIG. 12 is a fragmented elevational view of a further configuration of the head portion of the terminal.

DETAILED DESCRIPTION OF THE PREFERRED EMBODIMENT

Figure 1:
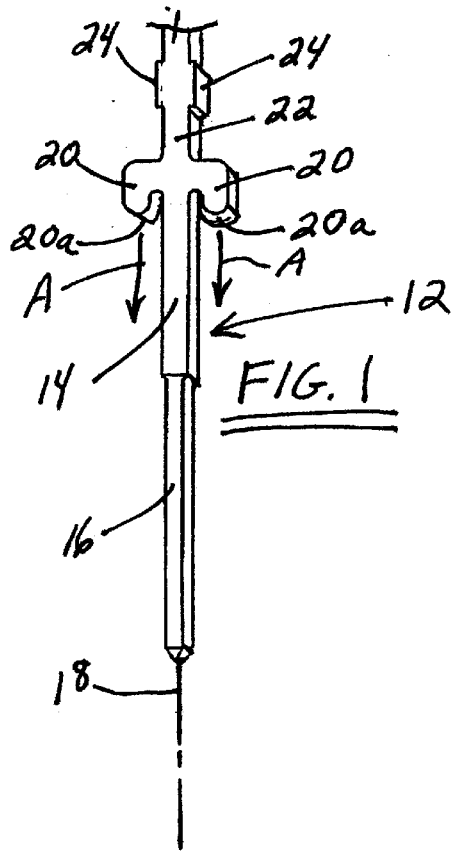
FIG. 1 is a perspective view of one embodiment of an electrical terminal incorporating the concepts of the invention.
Figure 2:
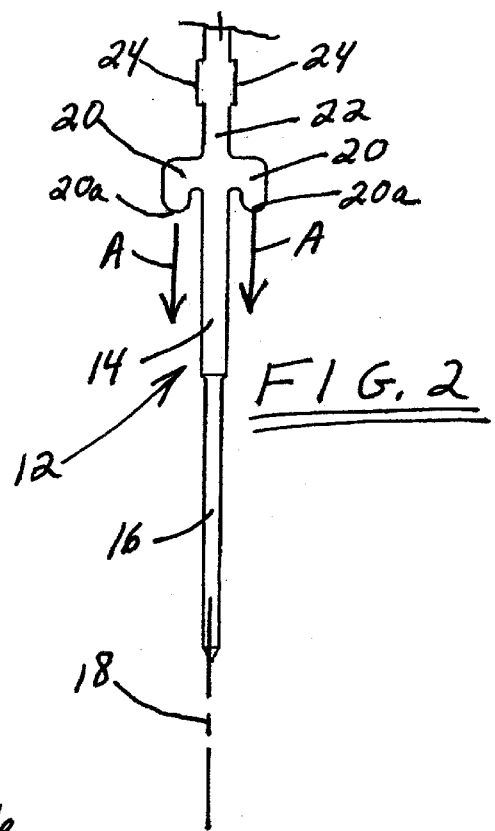
FIG. 2 is a side elevational view of the terminal of FIG. 1.

Referring to the drawings in greater detail, and first to FIGS. 1 and 2, one embodiment of a conductive terminal, generally designated 12, is shown according to the invention. The terminal is stamped of conductive sheet metal material and includes a pin or mounting portion 14 having a contact pin 16 projecting coaxially from the pin portion at one end thereof. Contact pin 16 may be plated with gold or other highly conductive material. The entire terminal defines a longitudinal axis 18 running coaxially through pin portion 14 and contact pin 16. A pair of wing portions 20 project laterally from pin portion 14. The wing portions are generally L-shaped and define contact tips 20a which face in the direction of arrows "A" toward contact pin 16 generally parallel to axis 18. A body portion 22 projects coaxially of pin portion 14 on the opposite side of wing portions 20, and a pair of shoulders 24 are formed during the stamping of the terminal to project laterally outwardly thereof.

Figure 3:
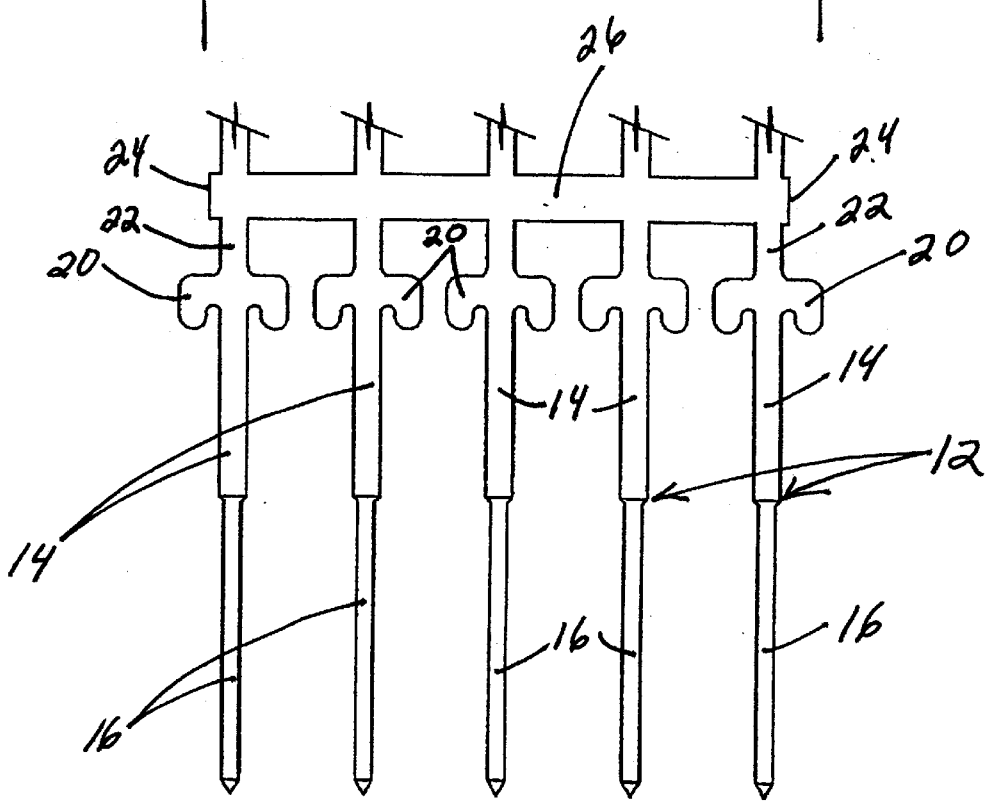
FIG. 3 is a plan view of a plurality of the terminals of FIG. 1 having been stamped from sheet metal material and still joined by a carrier strip.

FIG. 3 shows a plurality of terminals 12 having been stamped from a sheet of conductive metal material, with the terminals still being joined by a carrier strip 26 of the sheet metal material. The carrier strip may be used to gang-load a plurality of the terminals into a connector. On the other hand, carrier strip 26 can be severed to form laterally projecting shoulders 24 (FIGS. 1 and 2). These shoulders can be used for engagement by an appropriate tool to facilitate inserting the terminals individually into a connector.

FIG. 4 shows one of the terminals 12 assembled in an electrical connector, generally designated 28. The connector includes a dielectric circuit support member 30 which may be a shroud, for instance, of an electrical connector assembly. The support member may be molded of plastic material. The support member includes a through hole 32. A flat circuit, generally designated 34, is adhered to the top of support member 30. The circuit includes a flat dielectric substrate 36 having a conductor 38 on the top thereof. For instance, flat circuit 34 may be a flat flexible circuit which includes a flat flexible dielectric substrate 36 having a ductile conductive film or other circuit trace system 38 deposited on the substrate in an area at least about a hole 40 in the substrate.

At this point, it should be understood that the figures herein show a single terminal being used in various electrical connectors or connecting devices. This has been done in order to provide a clear and concise understanding of the concepts of the invention. However, as stated in the "Background", above, the invention has considerable utility and advantages in use with a high density connector arrangement, i.e., a connector which uses a plurality of terminal pins in closely-spaced arrays.

With that understanding, the single terminal 12 shown in FIG. 4 is assembled in connector 28 by inserting contact pin 16 and pin portion 14 through hole 40 in flat circuit 34 and into hole 32 in support member 30 in the direction of arrows "B". It can be seen that the cross-dimensions of contact pin 16 are less than the cross-dimensions of pin portion 14 and, particularly, less than the size of hole 32 in support member 30. This helps to avoid scraping contact pin 16 within the hole during the insertion process to prevent any plating on the contact pin from being scraped off of the pin during assembly. In addition, hole 40 in flat circuit 34 also may be larger than pin portion 14 so that no stresses whatsoever are created in substrate 36 of the circuit.

The invention contemplates that hole 32 in dielectric circuit support member 30 be sized relative to the cross-dimensions of pin portion 14 of terminal 12 to establish an interference fit therebetween. In other words, the pin portion is larger than the hole in the plastic support member. Therefore, when terminal 12 is inserted into the hole to the position shown in FIG. 4, support member 30, in essence, grips pin portion 14 of the terminal because of the interference fit of the pin portion within the hole. The terminal is inserted in a manner to positively engage contact tips 20a of wing portions 20 with conductor 38 of flat circuit 34 by a compressive force. Because of the interference fit between support member 30 and pin portion 14 of the terminal within hole 32, this interference fit is effective to maintain the contact tips of wing portions 20 in compressive engagement with conductor 38 of the flat circuit.

FIGS. 5 and 6 show another embodiment of a terminal 12 which includes wing portions 20A which are configured differently from wing portions 20 in the embodiment of FIGS. 1–4. Otherwise, like reference numerals are used in FIGS. 5 and 6 corresponding to like components described above and shown in FIGS. 1–4.

More particularly, wing portions 20A of the embodiment of the terminal shown in FIGS. 5 and 6 are formed at an angle to axis 18 of the terminal as well as at angle to flat circuit 34 and conductor 38. These angled wing portions provide a spring characteristic therein to facilitate maintaining the compressive engagement between contact tips 20a of the wing portions with conductor 38 as pin portion 14 of the terminal is gripped within hole 32 of plastic support member 14.

Figure 7:
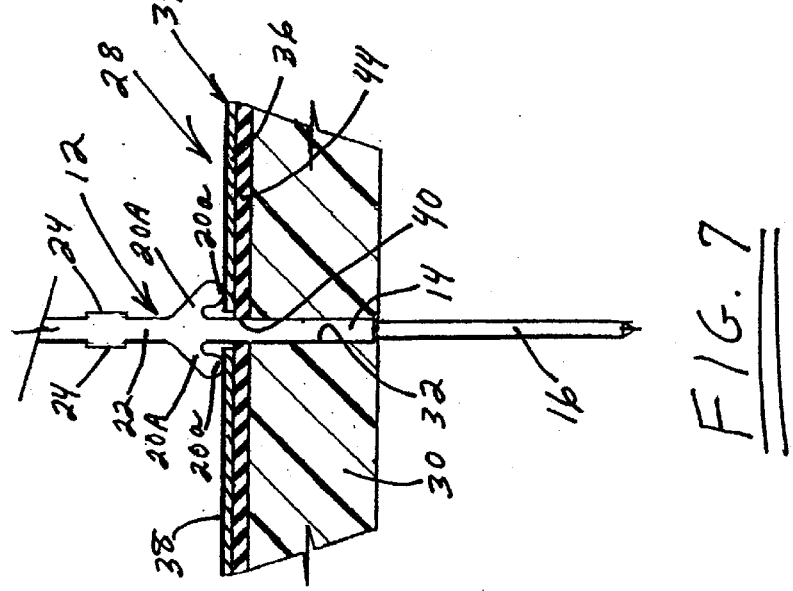
FIG. 7 is a view similar to that of FIG. 6, but with the connector incorporating a resilient layer between the flat circuit and the terminal support.

FIG. 7 shows a further embodiment wherein angled wing portions 20A again are used with terminal 12. However, in this embodiment, a resilient layer 44 is sandwiched between substrate 36 of flat circuit 34 and dielectric circuit support member 30. This resilient layer adds a further spring characteristic to the overall assembly to enhance the compressive engagement between contact tips 20a of wing portions 20A and conductor 38 of the flat circuit as pin portion 14 of the terminal is griped within hole 32 of the support member.

Figure 8:
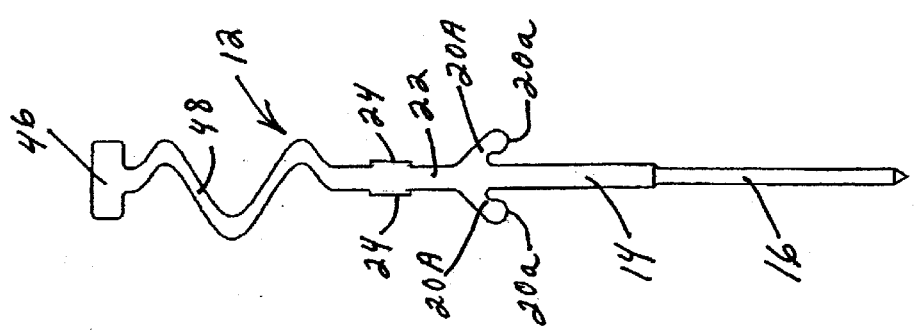
FIG. 8 is a side elevational view of the terminal of FIG. 5, with the terminal completed to incorporate a spring-supported head.

FIG. 8 shows the embodiment of terminal 20 illustrated in FIGS. 5–7, with the terminal completed to include a head portion 46 at an end of the terminal opposite contact pin 16. Head portion 46 is joined to pin portion 14 by a spring portion 48 which is stamped in a "wave" configuration.

Figure 9:
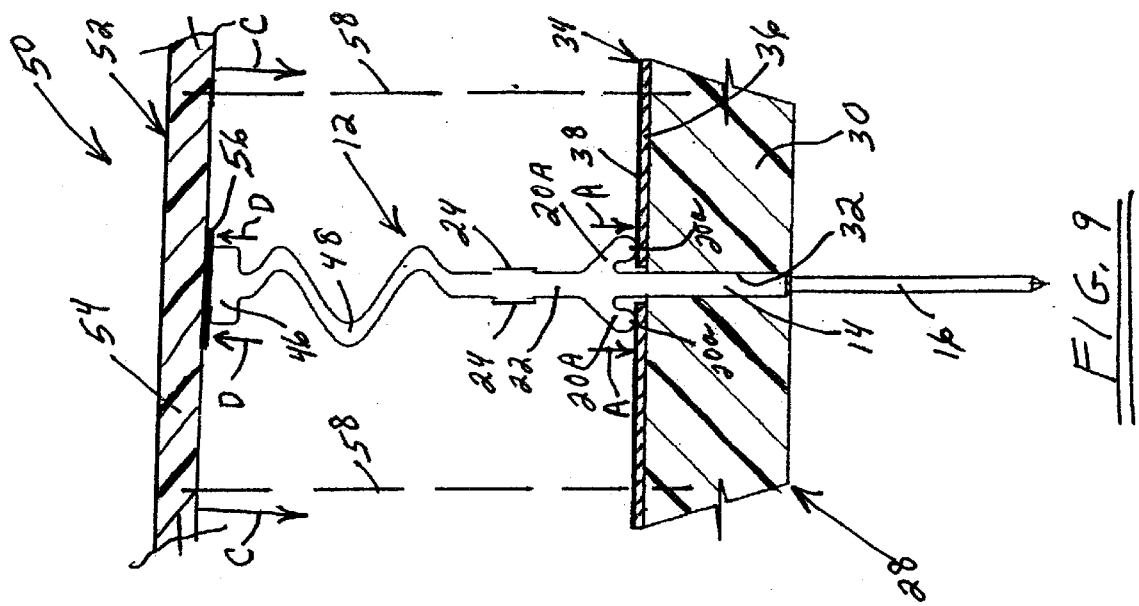
FIG. 9 is a section through a connector assembly incorporating the connector of FIG. 6 with the terminal of FIG. 8, and in combination with a second flat circuit connecting device.

Terminal 12 of FIG. 8 is shown in FIG. 9 in a connector assembly, generally designated 50, which includes connector 28 of FIG. 6 in combination with a second flat circuit in the form of a rigid printed circuit board, generally designated 52. Flat circuit 52 includes a dielectric substrate 54 having a conductor 56 on the bottom thereof. Flat circuit 52 is assembled to connector 28 by appropriate fasteners indicated by dotted lines 58. The fasteners may be of a type capable of drawing second flat circuit 52 toward connector 28 and first flat circuit 34 in the direction of arrows "C". In such an assembly, drawing second flat circuit 52 toward first flat circuit 34 in the direction of arrows "C" is effective to compress spring portion 48 of terminal 12. The spring portion, in turn, is effective to exert reactive forces in opposite directions longitudinally or axially of terminal 12. The result is that the spring portion will bias contact tips 20a of wing portions 20A compressively into engagement with conductor 38 of first flat circuit 34, while head portion 46 of the terminal is compressively biased into engagement with conductor 56 of second flat circuit 52.

FIG. 10 shows a connector assembly, generally designated 60, which employs one or more terminals 20 similar to the application described above in relation to FIG. 9. Connector assembly 60 includes a peripheral housing 62 which may be a machine cast component. The housing has an enlarged opening 64 in a bottom wall 66 thereof. The top of the housing is open and includes an inside, peripheral lip 68. A cover 70 closes the top of the housing and rests on top of lip 68. The cover may be permanently adhered to the housing or appropriately removably attached thereto. Connector assembly 60 is a "power" connector, and a ceramic circuit board 72 is fixed to a bottom inside face 73 of cover 70. Therefore, the cover is fabricated of such material as aluminum to provide a heat sink for the power circuit board 72. The circuit board is a ceramic board because of its high heat transfer capability. Such a connector assembly as connector assembly 60 may be used as a power control module in conjunction with a computer for an automobile, for instance, and there may be as many as 100 terminals 12 within the module. Only one terminal is shown in FIG. 10 in order to reasonably facilitate the illustration.

With that understanding, a dielectric circuit support member 30 is mounted within opening 64 in bottom wall 66 of housing 62. In other words, support member 30 is equivalent to support member 30 described above in relation to connector 28 in FIG. 4 and subsequent embodiments. In connector assembly 60, support member 30 may be a plastic member insert molded within opening 64 of the housing. The support member has a receptacle 74 integrally molded with the bottom thereof for receiving a mating wiring harness to be electrically coupled to contact pins 16 of terminals 12. A flat circuit 34 is mounted to a top inside face 75 of support member 30. Therefore, cover 70 forms a top circuit support structure and support member 30 forms a bottom circuit support structure of connector assembly 60.

In connector assembly 60 of FIG. 10, flat circuit 34 is a filter circuit which includes a plurality of chip capacitors 76 coupled to the conductor traces on the flat circuit. As with the embodiments of FIGS. 1–9, wing portions 20A of terminals 12 engage the conductors on the flat circuit. As with the embodiment of FIG. 9, head portions 46 of terminals 12 engage conductors on ceramic circuit board 72, while wing portions 20A engage conductors on flat circuit 34, and with spring portions 48 of the terminals biasing the head portions and the wing portions in opposite directions. Contact pins 16 project into receptacle 74 for engaging contacts of the mating wiring harness.

With connector assembly 60 being a filter connector, an enlarged ferrite filter block 80 is supported on a plurality of upstanding posts 82 of support member 30. The ferrite filter block has a plurality of holes 84 through which terminals 12 freely pass. A curable encapsulant 86 is used within the assembly to hold the ferrite filter block, filter circuit 34 and any other components securely within the inside of the assembly.

FIGS. 11 and 12 show different configurations of head portions 46 of terminal 12. In FIG. 11, the head portion has a rounded concave surface 90 for engaging second flat circuit 72 of connector assembly 60 in FIG. 10, or for engaging conductor 56 of second flat circuit 52 in FIG. 9. This rounded surface facilitates providing a positive engagement should the head portion tilt of "rock" for any reason. The head portion in FIG. 12 includes a pair of bumps 92 to provide a more positive engagement with the second flat circuit than would be provided with a larger flat surface.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An electrical connector assembly, comprising:
 a housing assembly including a bottom support structure having a top inside face and a top support structure having a bottom inside face;
 a first flat circuit mounted to the top inside face of the bottom support structure and having a hole therethrough;

a second flat circuit mounted to the bottom inside face of the top support structure; and at least one elongated conductive terminal extending through the hole in the first flat circuit into the bottom support structure and including a laterally projecting wing portion for engaging an appropriate conductor on the first flat circuit, a head portion for engaging an appropriate conductor on the second flat circuit, and a spring portion extending between the wing portion and the head portion to bias the wing portion and head portion in opposite directions into engagement with the respective conductors of the first and second flat circuits.

2. The electrical connector of claim 1 wherein said terminal includes a mounting portion extending into a hole in the bottom support structure of the housing assembly.

3. The electrical connector of claim 2 wherein said terminal includes a contact pin extending from said mounting portion beyond a bottom outside face of the bottom support structure for interconnection to a contact of an appropriate complementary connecting device.

4. The electrical connector of claim 1 wherein said spring portion of the terminal has a wave configuration.

5. The electrical connector of claim 1 wherein said terminal includes a pair of said wing portions projecting laterally from opposite sides of the terminals.

6. The electrical connector of claim 1 wherein said head portion of the terminal includes a rounded concave surface for engaging the conductors on the second flat circuit.

7. The electrical connector of claim 1 wherein said head portion of the terminal includes a pair of bumps for engaging the conductor on the second flat circuit.

8. The electrical connector of claim 1 wherein said second flat circuit comprises a ceramic based circuit.

9. The electrical connector of claim 1 wherein said first flat circuit comprises a filter circuit.

10. The electrical connector of claim 9 wherein said first flat circuit includes at least one capacitor coupled to the conductor thereon.

11. The electrical connector of claim 9 wherein said first flat circuit comprises a flexible circuit.

12. The electrical connector of claim 1 wherein said top support structure comprises a metal heat sink.

13. The electrical connector of claim 1, including a ferrite filter block surrounding the terminal.

14. The electrical connector of claim 13 wherein said ferrite filter block surrounds the spring portion of the terminal.

15. The electrical connector of claim 1 wherein said first flat circuit comprises a filter circuit having at least one capacitor coupled to the conductor thereon, along with a filter ferrite block surrounding a portion of the terminal, with an encapsulant surrounding at least portions of the filter block and filter circuit to hold those components in assembly.

16. The electrical connector of claim 1 wherein said housing assembly includes a peripheral casting with an open top which is closed by said top support structure.

17. The electrical connector of claim 16 wherein said bottom support structure comprises a dielectric plastic member overmolded in an opening in the bottom of said peripheral casting.

18. An electrical connector assembly, comprising:

a housing assembly including a bottom support structure having a top inside face and a top support structure having a bottom inside face;

a first flat circuit mounted to the top inside face of the bottom support structure and having a hole therethrough;

a second flat circuit mounted to the bottom inside face of the top support structure; and at least one conductive terminal extending into the bottom support structure and including a mounting portion extending through the hole in the first flat circuit into a hole in the bottom support structure of the housing assembly, a pair of laterally projecting wing portions for engaging an appropriate conductor on the first flat circuit, a contact pin extending from the mounting portion beyond a bottom outside face of the bottom support structure for interconnection to a contact of an appropriate complementary connecting device, a head portion for engaging an appropriate conductor on the second flat circuit, and a spring portion extending between the wing portions and the head portion to bias the wing portions and head portion in opposite directions into engagement with the respective conductors of the first and second flat circuits.

19. The electrical connector of claim 18 wherein said spring portion of the terminal has a wave configuration.

20. The electrical connector of claim 18 wherein said head portion of the terminal includes a rounded concave surface for engaging the conductors on the second flat circuit.

21. The electrical connector of claim 18 wherein said head portion of the terminal includes a pair of bumps for engaging the conductor on the second flat circuit.

22. The electrical connector of claim 18 wherein said first flat circuit comprises a filter circuit having at least one capacitor coupled to the conductor thereon, and said second flat circuit comprises a ceramic based circuit.

23. The electrical connector of claim 18 wherein said second flat circuit comprises a power circuit, and said top support structure comprises a metal heat sink.

24. The electrical connector of claim 18, including a ferrite filter block surrounding the spring portion of the terminal.

25. The electrical connector of claim 18 wherein said housing assembly includes a peripheral casting with an open top which is closed by said top support structure, said bottom support structure comprising a dielectric plastic member overmolded in an opening in the bottom of the peripheral casting.

26. An electrical connector assembly, comprising:

a housing assembly including a bottom support structure having a top inside face and a top support structure having a bottom inside face;

a first flat filter circuit mounted to the top inside face of the bottom support structure and having a hole therethrough and at least one capacitor thereon;

a second flat power circuit mounted to the bottom inside face of the top support structure;

said top support structure comprising a metal heat sink for the second flat power circuit; and at least one elongated conductive terminal extending through the hole in the first flat filter circuit into the bottom support structure and including a laterally projecting wing portion for engaging an appropriate conductor on the first flat circuit, a head portion for engaging an appropriate conductor on the second flat circuit, and a spring portion extending between the wing portion and the head portion to bias the wing portion and head portion in opposite directions into engagement with the respective conductors of the first and second flat circuits.

27. The electrical connector of claim 26 wherein said second flat circuit comprises a ceramic based circuit.

28. The electrical connector of claim 26 wherein said first flat circuit comprises a flexible circuit.

29. The electrical connector of claim 26, including a ferrite filter block surrounding the terminal.

30. The electrical connector of claim 29 wherein said ferrite filter block surrounds the spring portion of the terminal.

31. The electrical connector of claim 30, including an encapsulant surrounding at least portions of the ferrite filter block and the filter circuit to hold those components in assembly.

32. The electrical connector of claim 26 wherein said housing assembly includes a peripheral casting with an open top which is closed by said top support structure.

33. The electrical connector of claim 32 wherein said bottom support structure comprises a dielectric plastic member overmolded in an opening in the bottom of said peripheral casting.

* * * * *